US011619667B2

(12) United States Patent
Su et al.

(10) Patent No.: US 11,619,667 B2
(45) Date of Patent: Apr. 4, 2023

(54) ENHANCED LOOPBACK DIAGNOSTIC SYSTEMS AND METHODS

(71) Applicant: Advantest Corporation, Tokyo (JP)

(72) Inventors: Mei-Mei Su, Mountain View, CA (US); Seth Craighead, San Jose, CA (US)

(73) Assignee: Advantest Corporation, Tokyo (JP)

( * ) Notice: Subject to any disclaimer, the term of this patent is extended or adjusted under 35 U.S.C. 154(b) by 93 days.

(21) Appl. No.: 17/195,342

(22) Filed: Mar. 8, 2021

(65) Prior Publication Data

US 2021/0302498 A1    Sep. 30, 2021

Related U.S. Application Data

(60) Provisional application No. 63/002,657, filed on Mar. 31, 2020.

(51) Int. Cl.
 *G01R 31/317* (2006.01)
 *G01R 31/3185* (2006.01)
 (Continued)

(52) U.S. Cl.
 CPC ... *G01R 31/31716* (2013.01); *G01R 31/2884* (2013.01); *G01R 31/31724* (2013.01);
 (Continued)

(58) Field of Classification Search
 CPC ........ G01R 31/31716; G01R 31/31724; G01R 31/31725; G01R 31/318544; G01R 31/2884; H04L 1/243
 (Continued)

(56) References Cited

U.S. PATENT DOCUMENTS 7,200,170 B1 * 4/2007 Desandoli ............... H04B 3/46
 370/249
7,590,902 B1 * 9/2009 Tabatabaei ..... G01R 31/318508
 714/724
(Continued)

FOREIGN PATENT DOCUMENTS

EP    3093676 A1    11/2016
JP    2016-218042 A    12/2016
(Continued)

OTHER PUBLICATIONS

Sunter et al., Structural Tests for Jitter Tolerance in SerDes Receivers, 2005, IEEE, ITC paper 9.1, pp. 1-10. (Year: 2005).*
(Continued)

*Primary Examiner* — John J Tabone, Jr.

(57) ABSTRACT

Presented embodiments facilitate efficient and effective flexible implementation of different types of testing procedures in a test system. In one embodiment, a tester system diagnostic method includes forwarding test signals to a loopback component; receiving the test signals from the loopback component; and analyzing the test signals to diagnose whether or not the test system is experiencing problems associated with electrostatic discharges, including analysis of eye scan configuration data corresponding to characteristics of the test signals. In one exemplary implementation, analyzing the eye scan configuration data, including analyzing symmetry of a graphical representation (e.g., eye pattern, eye diagram, etc.) of the eye scan configuration data with respect to a horizontal graphical representation axis.

20 Claims, 10 Drawing Sheets

(51) Int. Cl.
*G01R 31/28* (2006.01)
*H04L 1/24* (2006.01)

(52) U.S. Cl.
CPC ............... *G01R 31/31725* (2013.01); *G01R 31/318544* (2013.01); *H04L 1/243* (2013.01)

(58) Field of Classification Search
USPC ......... 714/738, 724, 727; 324/224; 370/249, 370/241
See application file for complete search history.

(56) References Cited

U.S. PATENT DOCUMENTS

| | | | |
|---|---|---|---|
| 10,014,899 B2* | 7/2018 | Payne | G01R 31/2884 |
| 2009/0113258 A1 | 4/2009 | Parthasarathy | |
| 2010/0262877 A1* | 10/2010 | Narayan | G01R 31/318572 714/E11.155 |
| 2013/0043897 A1* | 2/2013 | Sethuram | G01R 31/318513 257/E23.002 |
| 2017/0139866 A1* | 5/2017 | Wallace | G06F 13/4027 |
| 2017/0160343 A1 | 6/2017 | Mobin et al. | |
| 2018/0019781 A1* | 1/2018 | Payne | H04L 7/02 |
| 2018/0188322 A1 | 7/2018 | Rogel-Favila et al. | |
| 2018/0205621 A1 | 7/2018 | Ungar et al. | |
| 2018/0276164 A1* | 9/2018 | Das Sharma | G06F 13/4022 |
| 2020/0033408 A1 | 1/2020 | Rogel-Favila et al. | |
| 2020/0151076 A1* | 5/2020 | Lacroix | G01R 31/2884 |
| 2021/0270888 A1* | 9/2021 | Treon | G01R 29/02 |
| 2021/0302498 A1* | 9/2021 | Su | G01R 31/31724 |

FOREIGN PATENT DOCUMENTS

| | | |
|---|---|---|
| TW | 200734653 A | 9/2007 |
| TW | 201024739 A | 7/2010 |
| TW | I418826 B | 12/2013 |
| TW | 201504647 A | 2/2015 |
| TW | 201907174 A | 2/2019 |
| WO | 2019164760 A1 | 8/2019 |

OTHER PUBLICATIONS

Srinivasan et al., Loopback DFT for Low-Cost Test of Single-VCO-Based Wireless Transceivers, Mar./Apr. 2008, IEEE, pp. 150-159 (Year: 2008).*

Meixner et al., External Loopback Testing Experiences with High Speed Serial Interfaces, 2008, IEEE, ITC Paper 4.1, pp. 1-10 . . . (Year: 2008).*

Lee, External Loopback Testing on High Speed Serial Interface, 2013, IEEE, pp. 148-155. (Year: 2013).*

Arora et al., SERDES External Loopback Test Using Production Parametric-Test Hardware, 2016, IEEE, ITC Paper 7.3, pp. 1-7. (Year: 2016).*

Texas Instruments Incorporated, DC to 4-GBPS Dual 1:2 Multiplexer/Repeater/Equalizer, Feb. 2006, TI, pp. 1-26. (Year: 2006).*

* cited by examiner

200

---

210
Forwarding test signals to a loop back component.

220
Receiving the test signals from the loop back component

230
Analyzing the test signals to diagnose whether or not the test system is experiencing problems, including analysis of eye scan configuration data corresponding to characteristics of the test signals.

FIG. 2

300
Skew Eye Scan Data Analysis
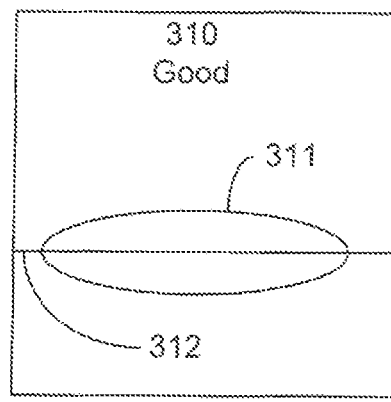
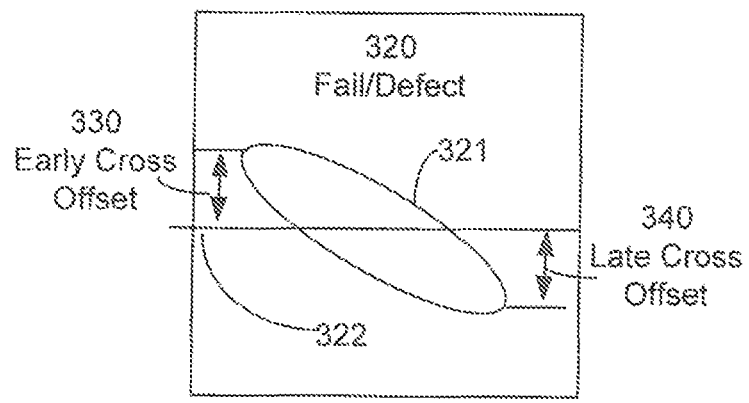
FIG. 3

400

410
Scanning the boundaries of the eye scan data configuration to determine the early and late eye end points (e.g., the points furthest in time from one another, etc.).

420
Determining if the eye scan data configuration end points are outside of acceptable symmetrical offset values from a configuration horizontal axis.

430
Identifying the associated channel/lane (e.g., transmitters and receivers, etc.) as failing the tester self-diagnostics if they are end points are outside acceptable symmetrical offset values.

FIG. 4

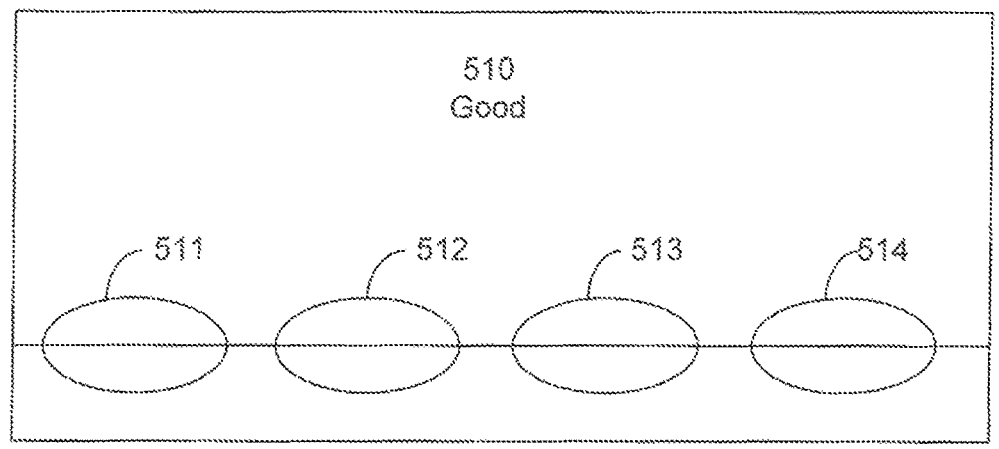
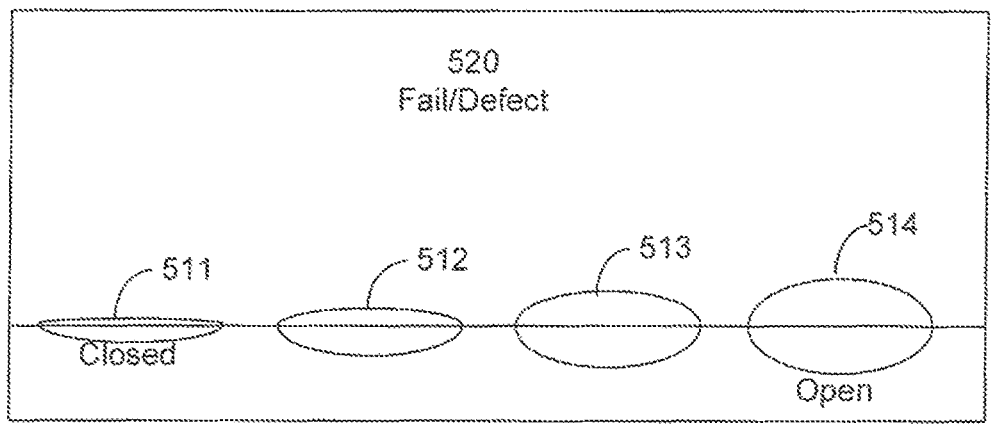
FIG. 5

600

610
Scanning the boundaries of an eye pattern to determine the width of the aeye pattern over time.

620
Determining if the eye scan configuration width varies beyond acceptable values over time.

630
Scanning the boundaries of the eye scan configuration to determine the symmetry of the eye opening/closure with respect to the horizontal axis over time.

640
Identifying the associated lane (e.g., transmitters and receivers, etc.) as failing the tester self-diagnostics if the eye scan configuration opening/closure varies over time.

FIG. 6

ENHANCED LOOPBACK DIAGNOSTIC SYSTEMS AND METHODS

RELATED APPLICATIONS

This application claims the benefit of and priority to provisional application 63/002,657 entitled Enhanced Loopback Systems and Methods filed Mar. 31, 2020, which is incorporated herein by reference.

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper testing operations. Having accurate and reliably functioning test equipment that is properly validated and debugged is important.

Inaccurate test equipment can lead to properly functioning devices under test (DUTs) being identified as defective and improperly functioning devices as being identified as good. This can lead to inaccurate yield issues (e.g., users getting unexpected yield losses, etc.). When unexpected test results begin to happen on a regular basis users often perform diagnostics and maintenance on the testing equipment itself. Running prior art maintenance and diagnostics on the testers may not identify any problems and indicate the test equipment is allegedly operating properly. In an effort to further understand and find an explanation for the unexpected test results, a user can go back and further investigate DUTs the tester had initially indicated were defective. If the further investigation reveals that the DUTs were actually not defective, then there is often a problem or issue with the self diagnostic capabilities of the test equipment.

One problem or issue with traditional self-diagnostic features is a susceptibility to "diagnostic escape". Various conditions in the test/diagnostic environment can create a "diagnostic escape" in which problems associated with the defective conditions escape detection during normal traditional diagnostics. One such condition that can cause self-diagnostic problems is the introduction of electrostatic discharges (ESD) into the tester. Electrostatic discharges (ESD) can detrimentally impact the testing equipment's ability to properly perform self-diagnostic operations.

SUMMARY

Presented embodiments facilitate efficient and effective systems and methods for diagnosing potential problems in test equipment. In one embodiment, a tester system diagnostic method includes forwarding test signals to a loopback component; receiving the test signals from the loopback component; and analyzing the test signals to diagnose whether or not the test system is experiencing problems associated with electrostatic discharges. Eye scan configuration data can be analyzed. The analyzing can include analysis of a graphical representation (e.g., eye pattern, eye diagram, etc.) of the eye scan configuration data corresponding to characteristics of the test signals. In one exemplary implementation, good test signals are tracked in the space in the opening of the eye and bad signals are outside the center portion of the eye pattern. The bad signals can form a boundary or outline of the eye pattern. Good signals are signals that are received substantially the same as transmitted and bad signals are not received substantially the same as transmitted.

In one embodiment, the analyzing includes a skew variation analysis to determine if a differential skew offset exists. The skew variation analysis can include determining if scanner eye pattern end points are outside of acceptable offset values from the horizontal axis. In one exemplary implementation, transmitters and receivers of a lane/channel are identified as failing the tester self-diagnostics for signals that are outside the acceptable offset values. In one exemplary implementation, the analyzing includes an amplitude offset defects analysis to determine if a differential amplitude offset exists. The amplitude offset defects analysis can include determining if there is a difference in the opening of a scan eye over time, wherein a narrower eye scan opening size over time indicates a defect in the ability of the tester to properly transmit and receive appropriate signals. The analyzing can include determining if variations cause resulting eye scan configuration data to deviate from expected norms. The analysis can include identification of diagnostic problems associated with electrostatic discharge defects.

In one embodiment, a tester system includes a loopback component and test equipment. The loopback component is configured to receive test signals and return the test signals. The test equipment is configured to forward the test signals to the loopback component and receive the test signals from the loopback component, wherein the test equipment includes diagnostic capabilities identifying problems associated with electrostatic discharge defects. In one exemplary implementation, the test equipment includes a data eye scanner that creates resulting eye scan configuration data based upon characteristics of the test signals received from the loopback component. The analyzing can include determining height and width of a resulting graphical representation of the eye scan configuration data. In one exemplary implementation, the eye scanner takes single shot scans allowing different eye scan configuration data to be captured over time. Aspects (e.g., height, width) of a resulting graphical representation of the eye scan configuration data can be determined and analyzed, and differences over time in the aspects can indicate an electrostatic problem. The analyzing can include determining if there are distortions and abnormalities that deviate from expected norms for resulting eye scan configuration data. The test equipment can include a sequencer that controls an eye scanner to be able to effectively catch problems associated with electrostatic discharge defects in the start of signaling. The test equipment can include Field Programmable Gate Array (FPGA) hardware modified to include a state machine configured to achieve tight synchronization of an eye scanner sampler at the start of signaling.

In one embodiment, a test system analysis method includes forwarding test signals to a loopback component; receiving the test signals from the loopback component; correlating the received test signal characteristics to eye scan configuration data; and analyzing the eye scan configuration data, including analyzing symmetry of a graphical representation of the eye scan configuration data with respect to a horizontal graphical representation axis. The graphical representation information can correspond to an eye scan image that is analyzed and if the image is not symmetrical around the horizontal graphical representation axis, a test channel transmitting and receiving the test signals is determined to have problems associated with potential electrostatic discharge interference. In one exemplary implementation, an early crossover point is offset or shifted above the horizontal graphical representation axis and the late crossover point is offset or shifted below the horizontal axis. The analyzing can include a cross-over offset analysis including scanning the boundaries of the eye to determine the early and late eye pattern end points; determining if the eye pattern end points are outside of acceptable offset values from the horizontal axis; and identifying lane transmitters and receivers corresponding to the eye pattern end points that are outside acceptable offset values as failing tester self-diagnostics and having potential electrostatic discharge problems. The eye scan configuration data can correspond to a plurality of eye scan representations from a test channel over time and respective ones of the plurality of eye scan representations that have different opening widths indicate a defect in the ability of the test channel to properly transmit and receive test signals, including adequately maintaining differential signal relationships. The analyzing can include determining if openings/closures of the eye patterns are symmetrical with respect to the horizontal axis.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 2 is a flow chart of an exemplary tester system diagnostic method in accordance with one embodiment, FIG. 3 is a block diagram of exemplary graphical representations of eye scan configuration data in accordance with one embodiment.

FIG. 4 is a flow chart of an eye diagram skew variation analysis process in accordance with one embodiment.

FIG. 5 is a block diagram of exemplary graphical representations of eye scan configuration data in accordance with one embodiment.

FIG. 6 is a flow chart of an exemplary eye diagram skew variation analysis process in accordance with one embodiment.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments facilitate convenient and efficient diagnostics of test equipment. In one embodiment, the systems and methods are directed to facilitating efficient and effective identification of skew and amplitude offset. In one embodiment, enhanced loopback systems and methods analysis is based upon a correspondence between ESD introduction in the testing systems and methods and defective testing equipment operations that cause skew and amplitude problems in the signals. In one exemplary implementation, enhanced loopback systems and methods "remove" a DUT from a test signal path and use transmission and reception of loopback signals to advantageously identify differential skew and amplitude offset defects within test lanes/channels of a tester system. The received signals are analyzed by a data eye pattern scanner in which signals that correspond to the space/area in the center of the eye are considered good signals (e.g., received same as intended transmitted, etc.) and bad signals (e.g., received not same as intended transmitted, etc.) are outside the blanck center part of the eye patter. In one embodiment, the bad signals are represented by black dots that together form the boundary or outline of the eye pattern.

Figure 1:
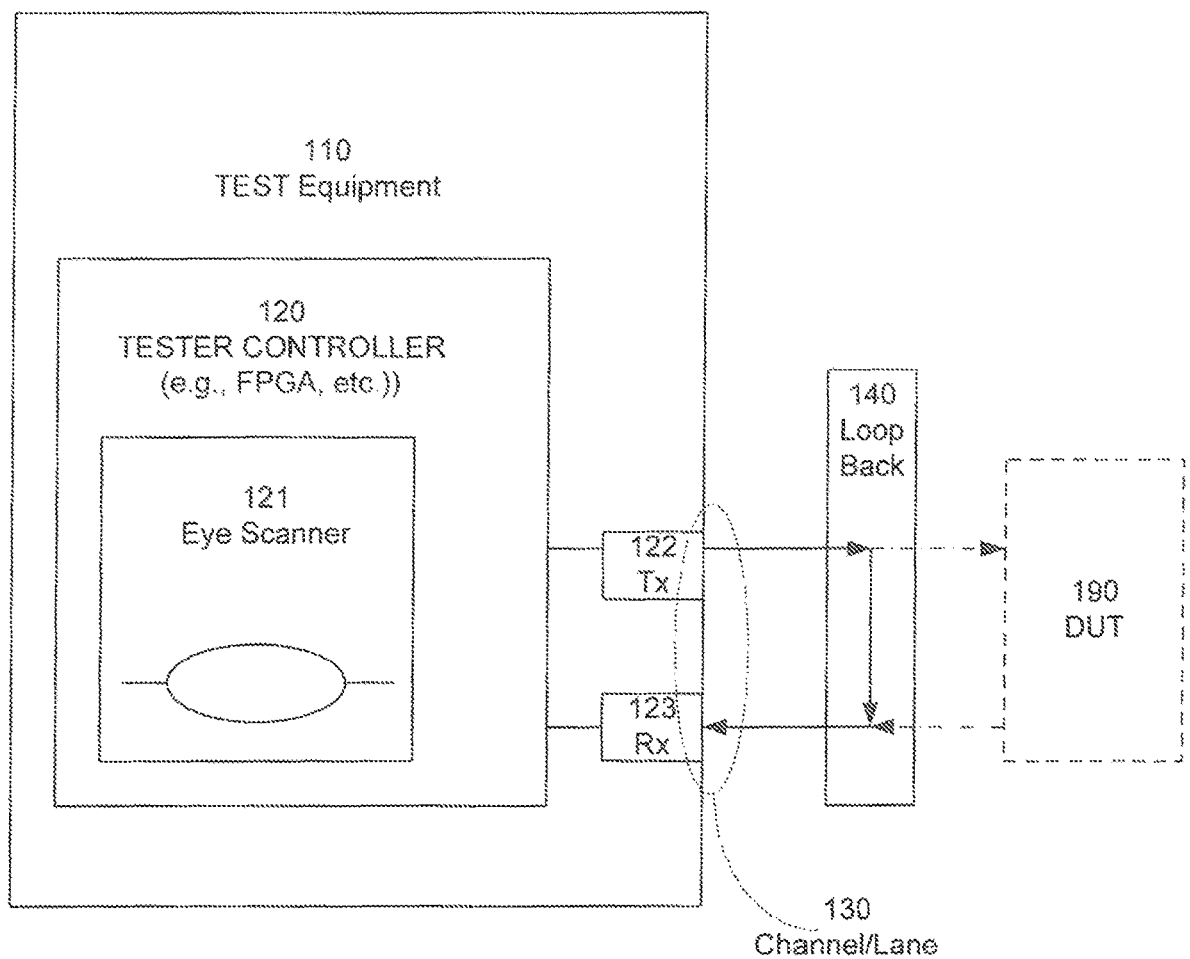
FIG. 1 is a block diagram of an exemplary enhanced loopback self-diagnostic test system in accordance with one embodiment.

FIG. 1 is a block diagram of an enhanced loopback self-diagnostic test system 100 in accordance with one embodiment. Enhanced loopback self-diagnostic test system 100 includes test equipment 110 coupled to loopback component 140 via test channel/lane 130. Test equipment 110 is configured to perform testing of devices under test (DUTs). Test equipment 110 is also configured to perform self-diagnostic operations. In one exemplary implementation, test equipment 110 includes a controller 120, transmit (Tx) port 122, and receive port 123. Controller 120 is coupled to transmit (Tx) port 122 and receive (Rx) port 123, which are in turn coupled to test channel/lane 130. In one embodiment, test channel/lane 130 is coupled to loopback component 140 instead of a device under test (DUT) 190.

In one embodiment, the components of enhanced loopback self-diagnostic test system 100 cooperatively operate to perform self-diagnosis of test equipment 110. Controller 120 is configured to direct testing and self-diagnostic operations. Controller 120 includes eye scanner component 121 that is configured to create and analyze graphical representation information corresponding to eye scan configuration data based on transmitted and received test signal characteristics. Transmit port 122 and receive port 123 are configured to transmit and receive test signals to and from loopback component 140, respectively. Channel/lane 130 is configured to communicate test signals between test equipment 110 and loopback component 140. Loopback component 140 is configured to receive the test signals from test equipment 110 and return them to the test system 110.

In one embodiment, graphical representations of eye scan data configurations correspond to eye patterns (also known as eye diagrams). In one exemplary implementation, the eye patterns can be presented on a display (e.g., an oscilloscope type display, etc.) in which the display vertical axis of corresponds to recurring sampling of a signal characteristic (e.g., amplitude, voltage, current, etc.). The horizontal axis can correspond to the timing or occurrence of a sample (e.g., repeated timing period, data rate, etc.). In one exemplary implementation, the vertical axis corresponds to sampling of signal voltage during a unit interval and the eye pattern is associated with the probability of different voltage occurrences.

In one embodiment, a signal can correspond to a sequence of bits or zeros and ones. Interference or noise can cause a signal distortion resulting in change a logical value of a bit from a logical zero to logical one or vice versa. In one exemplary implementation, a test equipment lane/channel transmitter sends a signal to a component that returns the signal back to a test equipment lane/channel receiver of the test equipment. The component can be a loopback component. A copy of the transmitted signal is retained and compared to the received or returned signal. If the two signals match they are represented in an a scan eye pattern as an open or blank dot. If the two signals do not match they are represented in an a scan eye pattern as a black dot. Sampling of the comparison results of the numerous signals that are sent and received over the lane and corresponding blank dots and black dots produce an eye pattern. The good matching sent and received signals contribute the bank or empty center of the eye pattern and the bad non-matching sent and received signals produce the boundaries and outside portions of the eye pattern. Distortions or difference in the eye patterns from known good test equipment can indicate a diagnostic problem. The diagnostic problem can be associated with ESD.

Normally, when test equipment is functioning properly over numerous signals, the graphical representation of eye scan configuration data is typically symmetrical with respect to a horizontal axis (e.g., eye pattern opening height, etc.). Traditional eye testing was typically limited to determining the height and width of the graphical representation without analyzing other aspects of eye configuration. The new enhanced loopback self-diagnostic systems and methods analyze variations (e.g., distortions, abnormalities, etc.) in the resulting graphical representation and eye scan configuration data that deviate from expected norms. The new enhanced loopback self-diagnostic systems and methods can use the analysis results to identify potential problems or issues with the test equipment. The enhanced loopback self-diagnostic systems and methods can use the analysis results to identify diagnostic problems associated with the ESD defects. In one embodiment, the eye scan configuration data corresponds to characteristics of test signals received back from a loopback component.

FIG. 2 is a flow chart of an exemplary tester system diagnostic method in accordance with one embodiment.

In block 210, test signals are forwarded to a loopback component.

In block 220, the test signals are received from the loopback component.

In block 230, the test signals are analyzed to diagnose whether or not the test system is experiencing problems, including analysis of eye scan configuration data corresponding to characteristics of the test signals. The problems can be associated with electrostatic discharges. In one exemplary implementation, good test signals are tracked in/correspond to the space in the opening of the eye and bad signals are tracked in/correspond to the space outside the eye. In one exemplary implementation, the good signals are signals that are received substantially the same as transmitted and bad signals are not received substantially the same as transmitted.

In one embodiment, self-diagnosis includes a skew variation analysis. FIG. 3 is a block diagram of exemplary graphical representations of eye scan data configurations in accordance with one embodiment. The illustration of a graphical representation of eye scan data configuration 310 on the top portion of FIG. 3 shows an eye scan data configuration pattern corresponding to good test signals. The "eye" 311 is symmetrical with respect to the horizontal axis 312. The illustration of graphical representation of eye scan data configuration 320 on the bottom portion of FIG. 3 shows an eye scan data configuration pattern corresponding to bad test signals. In one exemplary implementation, the bad test signals are a result of test equipment generated electrostatic interference on the test signals. The "eye" 321 is not symmetrical with respect to the horizontal axis 322, there is an early cross offset 330 and a late cross offset 340.

In one embodiment, a skew variation analysis includes additional processes that advantageously analyze and identify the crossover offsets. The processes can include features to scan the boundaries of the eye pattern to determine the early and late eye pattern end points (e.g., the points furthest in time from one another). Then the processes determine if the eye pattern end points are outside of acceptable offset values from the horizontal axis. If they are outside acceptable offset values, the associated lane/channel (e.g., including transmitters, receivers, coupling wiring, etc.) are identified as failing the tester self-diagnostics.

In one embodiment, analyzing the eye scan configuration data includes analyzing symmetry of a graphical representation of the eye scan configuration data with respect to a horizontal graphical representation axis. The graphical representation information can correspond to an eye scan pattern/diagram that is analyzed and if the pattern/diagram is not symmetrical around the horizontal graphical representation axis, a test channel transmitting and receiving the test signals is determined to have problems. The problems can be associated with potential electrostatic discharge interference. In one exemplary implementation, an early crossover point is offset or shifted above the horizontal graphical representation axis and the late crossover point is offset or shifted below the horizontal axis.

FIG. 4 is a flow chart of a diagram skew variation analysis process 400 in accordance with one embodiment.

In block 410, the boundaries of the eye scan configuration data are scanned to determine the early and late eye pattern end points (e.g., the points furthest in time from one another, etc.)

In block 420, determining if the eye scan configuration data end points are outside of acceptable symmetrical offset values from a configuration horizontal axis.

In block 430, identifying the associated lane/channel (e.g., transmitters and receivers, etc.) as failing the tester self-diagnostics if the eye scan configuration data has end points that are outside acceptable symmetrical offset values.

In one embodiment, self-diagnosis includes an amplitude variation analysis. Normally, good eye scan configuration data corresponds to an eye pattern that has substantially the same size opening over time. In one embodiment, eye scan configuration data corresponds to eye scan configuration data that does not have substantially the same size opening over time is considered to indicate a defect. The early eye pattern opening configurations can be narrower than later eye pattern opening configurations. In one embodiment, the difference in eye pattern opening size over time indicates a defect in the ability of the test equipment to properly transmit and receive appropriate signals. The eye scan configuration data can correspond to a plurality of eye scan representations from a test channel over time and respective ones of the plurality of eye scan representations that have different opening widths indicate a defect in the ability of the test channel to properly transmit and receive test signals. In one embodiment differential signaling is utilized to facilitate signal noise/interference immunity (e.g., a signal is a reference for another signal value, a reference is another signal rather than ground, etc.) and a defect can include an inability to adequately maintain differential signal relationships.

FIG. 5 is a block diagram of exemplary graphical representations of eye scan data configurations in accordance with one embodiment. The illustration of graphical representation of eye scan data configuration 510 on the top portion of FIG. 5 shows a plurality of eye scan data configuration patterns corresponding to good test signals over time. The "eyes" 511, 512, 513, and 514 are open the same amount and symmetrical with respect to the horizontal axis 512. The illustration of a graphical representation of eye scan data configuration 520 on the bottom portion of FIG. 5 shows an eye scan data configuration pattern corresponding to bad test signals. In one exemplary implementation, the bad test signals are a result of test equipment generated electrostatic interference on the test signals. The "eyes" 521, 522, 523, and 524 are not open the same amount. At the start of signaling the eye has a relatively narrower/closed opening compared to the later openings over time. The width of eye 512 is narrower than 522, which is narrower than 523, which is narrower than 524. The early closure can be due to defects in the tester that prevent the tester from adequately maintaining differential signals relationships to one another (e.g., different DC offsets, etc.). In addition, the closure/openness of the "eyes" are not symmetrical with respect to the horizontal axis 522. For example, in the early eye configurations towards the left of the fail/defect diagram 520, the top half of the eye above the horizontal axis may be more "closed" than the bottom half below the horizontal axis. The top portion or opening of "eyes" 521, 522, 523, and 524 is narrower than the respective bottom portion or opening of "eyes" 521, 522, 523, and 524. These can be indications of a defective testing lane.

The analyzing can include determining if openings/closures of the eye scans for a given pattern (511, 512, 513, 514, etc.) are symmetrical with respect to the horizontal axis. In one exemplary implementation, the analyzing includes determining if openings/closures of the early eye patterns (e.g., 511 and 512) are symmetrical with respect to the horizontal axis.

In one embodiment, the enhanced loopback systems and methods include operating the eye scanner in a mode that takes single shot scans. This allows the different data eye configurations to be captured over time.

In one embodiment, the abnormal amplitude test equipment behavior is detectable very early in signaling. Before signaling starts both signals are sitting at electrically idle or zero volts. When signaling starts one can swing high and the other can swing low. One side of an eye pattern can be open more and the other side of the eye pattern can be closed more. In one exemplary implementation, the enhanced loopback systems and methods include a sequencer that controls the eye scan mechanism to be able to effectively catch these signaling issues in the start of signaling. Prior art software driven/controlled eye testing are not typically able to react fast enough to capture and analyze the earliest signals at the initiation of testing (e.g., startup, immediately after leaving electrical idle, etc.). In one embodiment, a new enhanced loopback systems and methods includes hardware modified to include a state machine to achieve tight synchronization of the eye scanner sampler at the start of signaling. The modification can include a sequencer. The sequencer can trigger initiation of a scan. In one exemplary implementation, the sequencer tightly controls and synchronizes the beginning of eye diagram scan data gathering to the beginning of signal sampling. In one embodiment, firmware is utilized to achieve tight synchronization of the eye scanner sampler at the start of signaling. In one exemplary implementation, a field programmable gate array (FPGA) utilized to achieve tight synchronization of the eye scanner sampler at the start of signaling.

Figure 10:
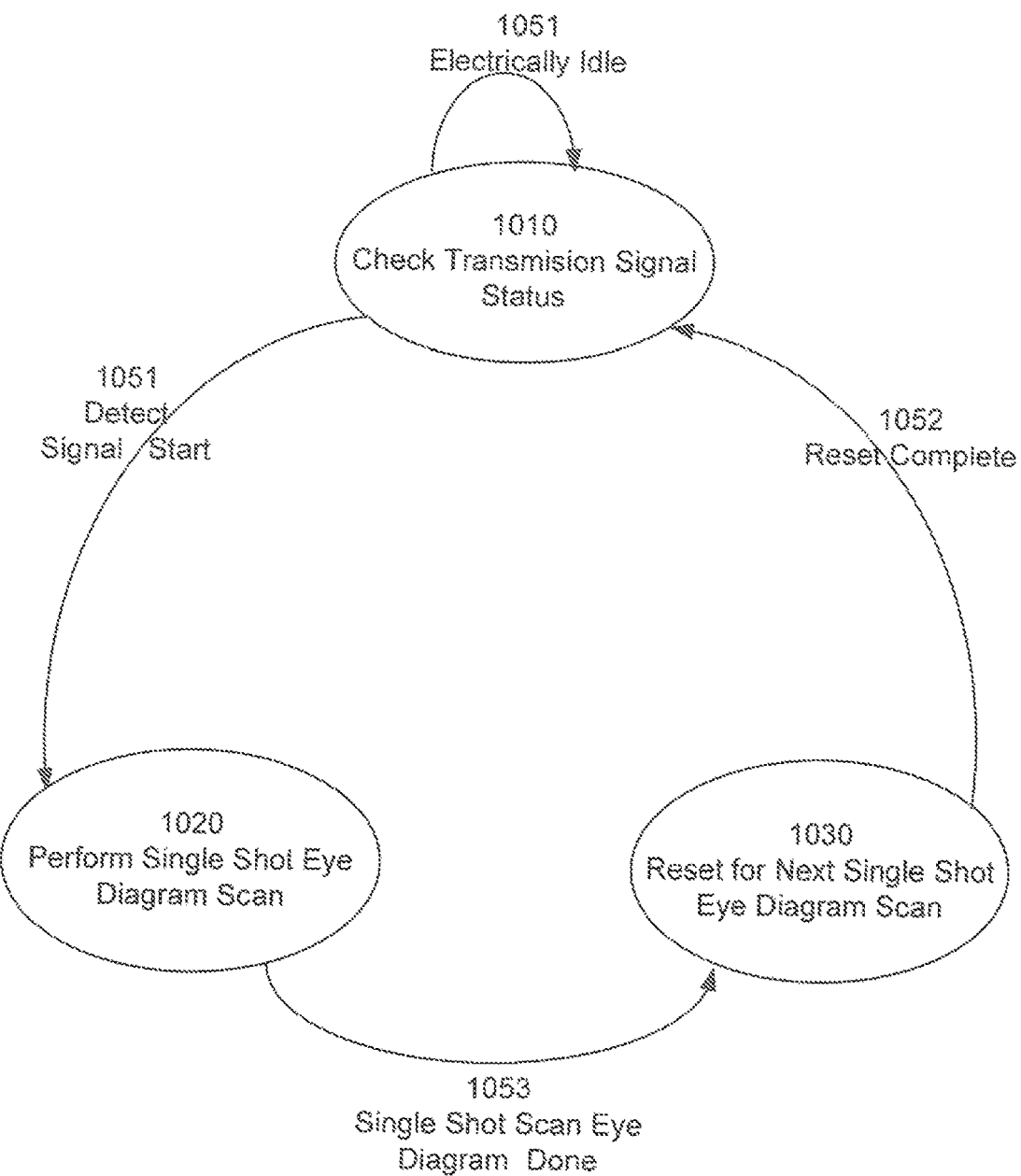
FIG. 10 is a block diagram of an exemplary state machine diagram in accordance with one embodiment.

FIG. 10 is a block diagram of an exemplary state machine diagram in accordance with one embodiment. In state 1010 the state machine checks transmission signal status. If the status is electrically idle the state machine continues to checks transmission signal status in transition 1051. If the state machine detects a signal start the state machine makes transition 1051 to state 1020 and performs a single shot eye diagram scan (e.g., similar to one of eyes 521, 522, 523, 524, etc.). When the state machine completes the single shot eye diagram scan the state machine makes transition 1053 to state 1030 and performs a reset to prepare for the next single shot eye diagram scan (e.g., similar to one of eyes 521, 522, 523, 524, etc.). When the state machine completes the reset the state machine makes transition 1054 to back state 1010 and performs checks the transmission signal status.

FIG. 6 is a flow chart of a diagram skew variation analysis process 600 in accordance with one embodiment.

In block 610, the boundaries of a graphical representation of eye scan data configuration is scanned to determine a characteristic of an eye pattern/diagram feature over time. In one embodiment, the boundaries of the eye scan configuration are scanned to determine the width of an eye pattern opening/closure over time.

In block 620, a determination is made if the characteristic of a graphical representation of the eye scan data configuration varies beyond acceptable values over time. In one embodiment, a determination is made if the eye pattern width varies beyond acceptable values over time.

In block 630, the boundaries of the graphical representation of the eye scan data configuration are scanned to determine the symmetry of the eye pattern feature with respect to the horizontal axis over time. In one embodiment, the boundaries of the eye scan configuration are scanned to determine the symmetry of the eye pattern opening/closure with respect to the horizontal axis over time.

In block 640, the associated lane (e.g., transmitters, receivers, etc.) is identified as failing the tester self-diagnostics if the eye scan configuration feature varies over time.

In one embodiment, associated lane/channel (e.g., transmitters, receivers, etc.) is identified as failing the tester self-diagnostics if the eye scan configuration opening/closure varies over time.

Thus, enhanced loopback systems and methods can provide more reliable and accurate diagnostics than conventional approaches. In one embodiment, enhanced loopback systems and methods can enable accurate identification/assignment of problems in the tester or test equipment versus the DUTs. Enhanced loopback systems and methods can reduce/eliminate diagnostic escapes associated with ESD tester defects. Enhanced loopback systems and methods can help users to avoid corresponding erroneous yield indications and wasting time tracking down tester faults.

Figure 7:
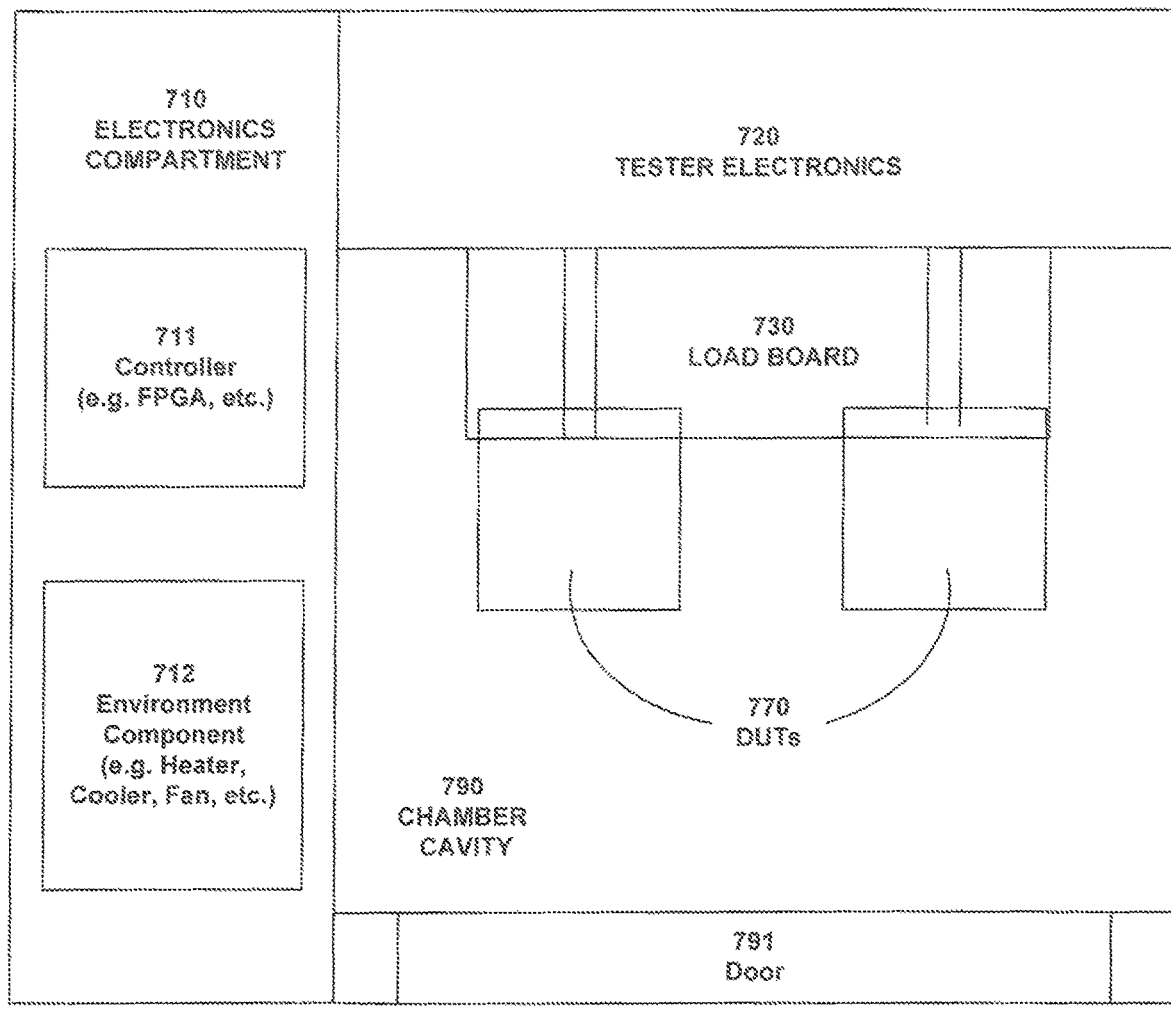
FIG. 7 is a block diagram of an exemplary testing system in accordance with one embodiment.
Figure 8:
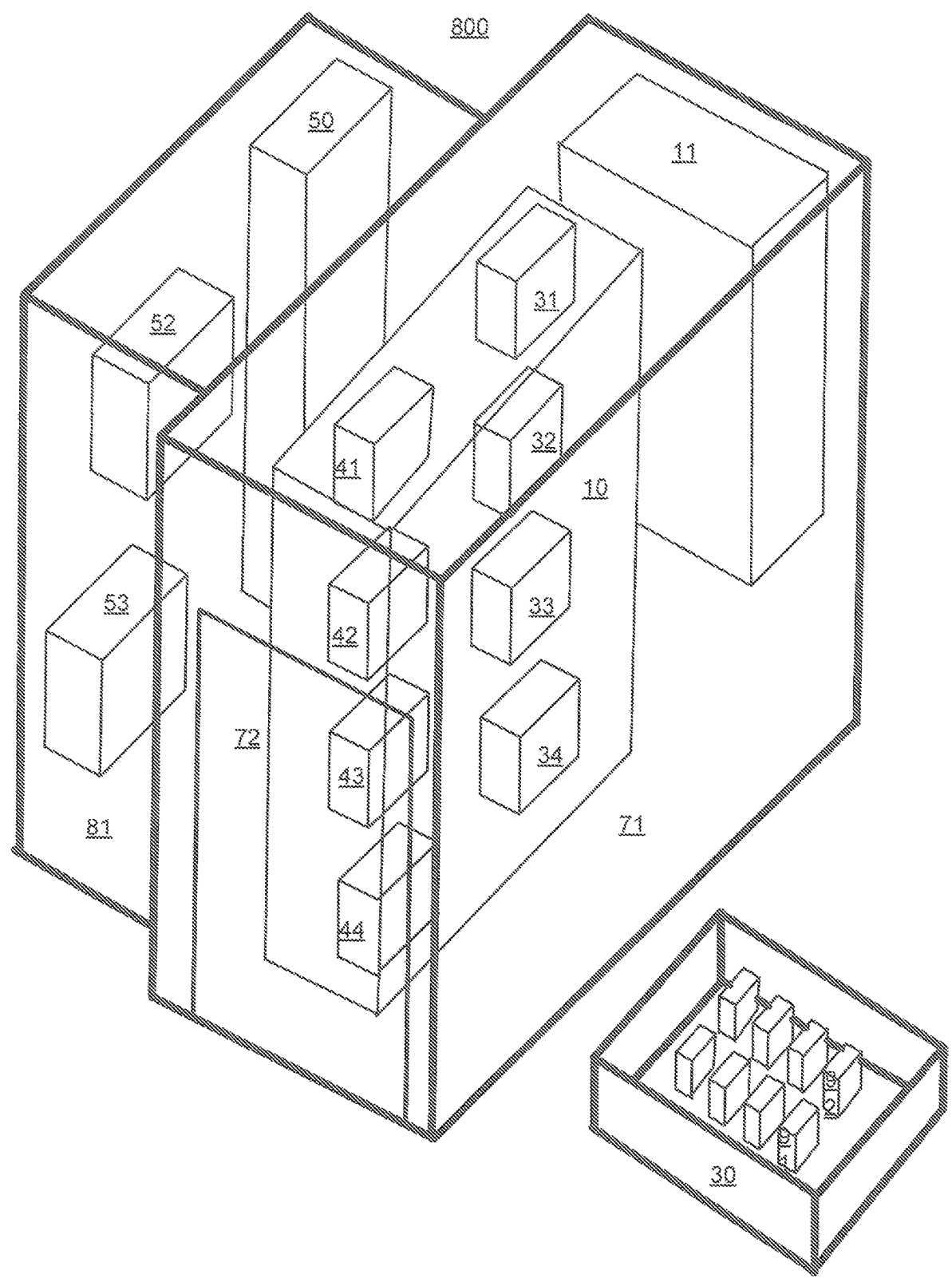
FIG. 8 is a block diagram of an exemplary testing system in accordance with one embodiment.
Figure 9:
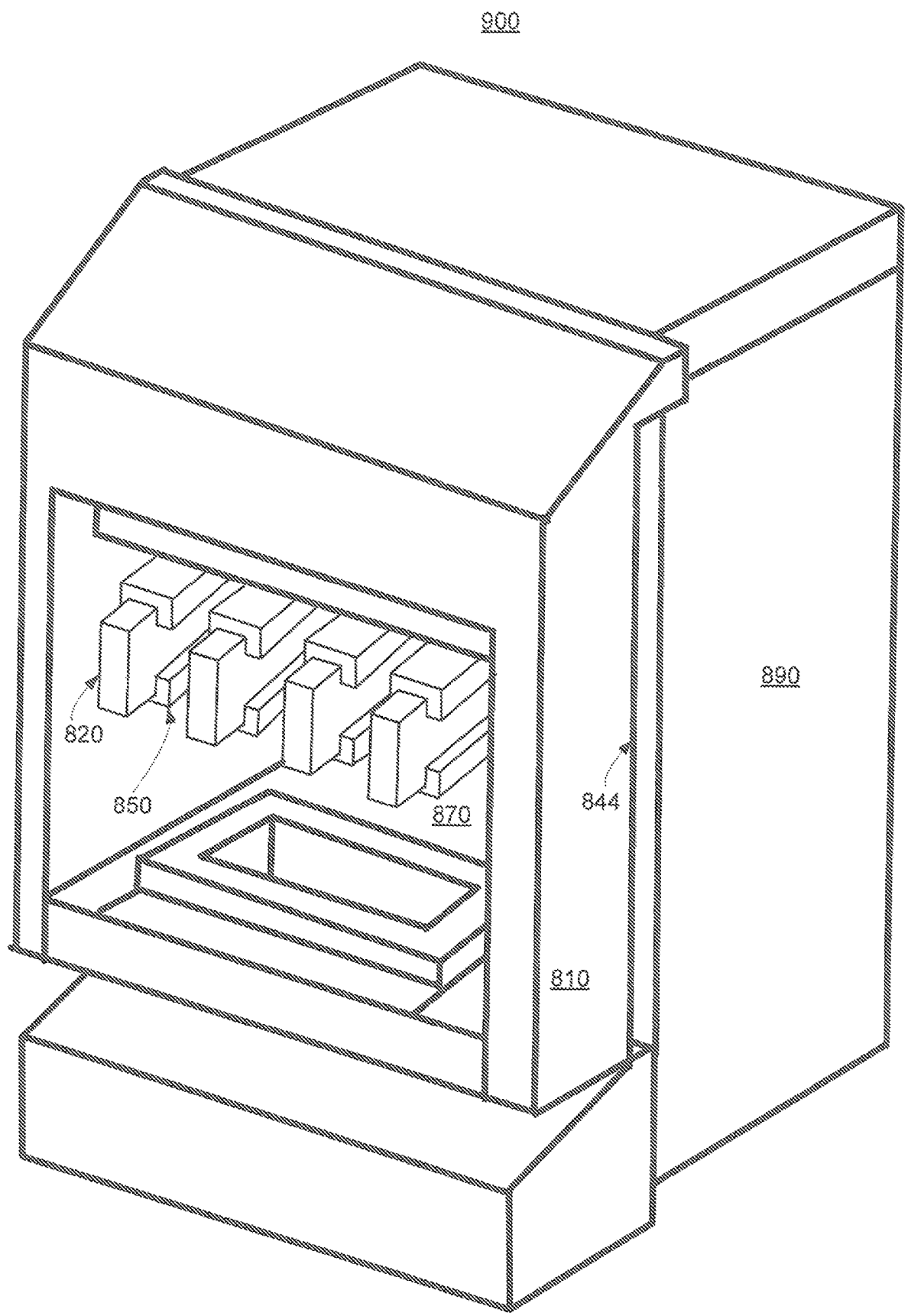
FIG. 9 is a block diagram of an exemplary test system in accordance with one embodiment.

In one embodiment, enhanced auxiliary interface test systems and methods can be implemented in test systems similar to the embodiments shown in the FIGS. 7, 8, and 9.

FIG. 7 is a block diagram of an exemplary testing system 700 in accordance with one embodiment. Testing system 700 includes electronics compartment 710 and tester electronics 720, loadboard 730, DUTs 770, and testing chamber 790 with door 791. Electronics compartment 710 includes controller 711 and environment compartment 712. Enhanced loopback components can be inserted instead of the DUTs for diagnostic analysis (e.g., of tester electronics 720, etc.).

FIG. 8 is a block diagram of an exemplary testing system in accordance with one embodiment. It consists of a large controlled environmental chamber or oven 71 that contains an oven rack 10 and heating and cooling elements 11. The oven rack 10 contains devices under test (DUTs) in a number of loadboard trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The tester or test head 81 contains various racked components, including system controller network switches 52, system power supply components 53, and tester slices 50 (the tester slice contains the tester electronics). The loadboard trays (e.g., 30, 31, etc.) are connected to tester slices 50 (multiple loadboard trays can be coupled to a single tester slice). There is also a block diagram of a tester tray 30 and devices under test (e.g., 91, 92, etc.). The loadboard trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location). Enhanced loopback components can be inserted instead of the DUTs for diagnostic analysis of tester electronics.

In one embodiment, a test system includes a device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their loadboards can be conveniently setup to accommodate different device form factors. In one embodiment, loadboards are configured with device under test interfaces and universal primitive interfaces. In one exemplary implementation, the device interface board can control an ambient environment of a device under test.

FIG. 9 is a block diagram of an exemplary test system 800 in accordance with one embodiment. Test system 800 includes a testing primitive 890 (e.g., containing the testing control hardware and power supply components for the devices under test, etc.) and a device interface board (DIB) 810 disposed in front of and coupled to the primitive 890. In one embodiment, the device interface board 810 is a partial enclosure. The loadboard is also coupled to and electrically interfaces with the primitive 890 to obtain power and high-speed electrical signals for testing the device under test 820. The device interface board can include air flow channels 844 that allow air flow to and from the device under test environment. The air flow channels 844 can include baffles. The device interface board 810 partial enclosure includes a device under test access interface 870 that enables easy physical access (e.g., unobstructed, unimpeded, etc.) to the devices under test. Environmental control components 811 and 814 control and maintain device under test ambient environmental conditions (e.g., temperature, air flow rate, etc.). The environmental control components can create an environmental envelope that prevents or mitigate interference from outside environmental conditions on the operations of devices under test. In one embodiment, access to test system 800 may be easier than test system 700. Enhanced loopback components can be inserted instead of the DUTs for diagnostic analysis of tester electronics (e.g., in primitive 890, etc.).

While the invention has been described in conjunction with the preferred embodiments, it will be understood that they are not intended to limit the invention to these embodiments. On the contrary, the invention is intended to cover alternatives, modifications, and equivalents. The description is not intended to be exhaustive or to limit the invention to the precise forms disclosed, and obviously many modifications and variations are possible.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory"

computer-readable media comprises all computer-readable media, with the sole exception being a transitory, propagating signal.

It is appreciated that the description includes exemplary concepts or embodiments associated with the novel approach. It is also appreciated that the listing is not exhaustive and does not necessarily include all possible implementation. The concepts and embodiments can be implemented in hardware, firmware, software, and so on. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A tester system diagnostic method comprising:
forwarding test signals to a loopback component;
receiving the test signals from the loopback component;
analyzing the test signals as part of self diagnostics of a test system itself, including to diagnose whether or not the test system is experiencing diagnostic escape problems associated with electrostatic discharges, including analysis of eye scan configuration data corresponding to characteristics of the test signals, in which good test signals are tracked in the space in the opening of an associated eye pattern and bad signals are outside the center portion of the eye pattern and form a boundary of the eye pattern, wherein the good signals are signals that are received substantially the same as transmitted and the bad signals are not received substantially the same as transmitted.

2. The tester system diagnostic method of claim 1, wherein the analyzing includes a skew variation analysis to determine if a differential skew offset exists.

3. The tester system diagnostic method of claim 2, wherein the skew variation analysis includes determining if scanner eye pattern end points are outside of acceptable offset values from the horizontal axis, wherein transmitters and receivers of a lane are identified as failing self diagnostics of the tester system for signals that are outside the acceptable offset values.

4. The tester system diagnostic method of claim 1, wherein the analyzing includes an amplitude offset defects analysis to determine if a differential amplitude offset exists.

5. The tester system diagnostic method of claim 4, wherein the amplitude offset defects analysis includes determining if there is a difference in eye pattern opening over time, wherein a narrower difference in eye pattern opening size over time indicates a defect in the ability of the tester system to properly transmit and receive appropriate signals, including the good signals.

6. The tester system diagnostic method of claim 5, the analyzing includes determining if variations in the resulting eye scan configuration data deviates from expected norms.

7. The tester system diagnostic method of claim 5, wherein the analysis includes identification of diagnostic escape problems associated with electrostatic discharge defects.

8. A tester system comprising:
a loopback component configured to receive test signals and return the test signals; and
test equipment configured to forward the test signals to the loopback component and receive the test signals from the loopback component, wherein the test equipment includes self diagnostic capabilities identifying diagnostic escape problems associated with electrostatic discharge defects.

9. The tester system of claim 8, wherein the test equipment includes a data eye scanner that creates resulting eye scan configuration data based upon characteristics of the test signals received from the loopback component.

10. The tester system of claim 9, wherein the diagnostic capabilities include determining height and width of a resulting graphical representation of the eye scan configuration data.

11. The tester system of claim 9, wherein the eye scanner takes single shot scans allowing different eye scan configuration data to be captured over time, wherein height and width of a resulting graphical representation of the eye scan configuration data are determined and differences over time in the width indicate an electrostatic problem.

12. The tester system of claim 9, wherein the diagnostic capabilities include determining if there are distortions and abnormalities that deviate from expected norms for resulting eye scan configuration data.

13. The tester system of claim 9, wherein the test equipment includes a sequencer that controls the eye scanner to be able to effectively catch diagnostic escape problems associated with the electrostatic discharge defects in the start of signaling.

14. The tester system of claim 9, wherein the test equipment includes Field Programmable Gate Array (FPGA) hardware modified to include a state machine configured to achieve tight synchronization of an eye scanner sampler at the start of signaling.

15. A test system analysis method comprising:
forwarding test signals to a loopback component;
receiving the test signals from the loopback component;
correlating characteristics of the received test signal to eye scan configuration data; and
performing self diagnostics of a test system itself, including analyzing the eye scan configuration data, including analyzing symmetry of a graphical representation of the eye scan configuration data with respect to a horizontal graphical representation axis.

16. The test system analysis method of claim 15, wherein the graphical representation information corresponds to an eye pattern that is analyzed and if an image representing the eye pattern is not symmetrical around the horizontal graphical representation axis, a test channel transmitting and receiving the test signals is determined to have problems associated with potential electrostatic discharge interference.

17. The test system analysis method of claim 16, wherein an early crossover point is offset or shifted above the horizontal graphical representation axis and a late crossover point is offset or shifted below the horizontal graphical representation axis.

18. The test system analysis method of claim 15, wherein the analyzing includes a crossover offset analysis comprising:
   scanning the boundaries of an eye pattern to determine early and late eye pattern end points;
   determining if there are eye pattern end points ae-outside of acceptable offset values from the horizontal graphical representation axis; and
   identifying the eye pattern end points that are outside acceptable offset values and corresponding lane transmitters and receivers as failing tester self-diagnostics and having potential electrostatic discharge problems.

19. The test system analysis method of claim 15, wherein the eye scan configuration data corresponds to a plurality of eye scan representations from a test channel over time and respective ones of the plurality of eye scan representations that have different opening widths that indicate a defect in the ability of the test channel to properly transmit and receive test signals, including adequately maintaining differential signal relationships.

20. The test system analysis method of claim 15, wherein the analyzing includes determining if openings/closures of eye patterns are symmetrical with respect to the horizontal graphical representation axis.

\* \* \* \* \*